(12) United States Patent
Lee et al.

(10) Patent No.: US 10,243,031 B2
(45) Date of Patent: Mar. 26, 2019

(54) DISPLAY DEVICE

(71) Applicant: SAMSUNG DISPLAY CO., LTD., Yongin-si, Gyeonggi-do (KR)

(72) Inventors: Hyeonbum Lee, Yongin-si (KR); Eonjoo Lee, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 1 day.

(21) Appl. No.: 15/644,067

(22) Filed: Jul. 7, 2017

(65) Prior Publication Data

US 2018/0069070 A1 Mar. 8, 2018

(30) Foreign Application Priority Data

Sep. 6, 2016 (KR) .................. 10-2016-0114451

(51) Int. Cl.
| H01L 27/00 | (2006.01) |
| H01L 27/32 | (2006.01) |
| H01L 51/00 | (2006.01) |
| H01L 51/52 | (2006.01) |

(52) U.S. Cl.
CPC ...... *H01L 27/3272* (2013.01); *H01L 27/3211* (2013.01); *H01L 51/0097* (2013.01); *H01L 51/5234* (2013.01); *H01L 51/5281* (2013.01); *H01L 51/5284* (2013.01); *H01L 27/322* (2013.01); *H01L 51/5265* (2013.01); *H01L 2251/5338* (2013.01)

(58) Field of Classification Search
CPC ................................................. H01L 27/3272
See application file for complete search history.

(56) References Cited

U.S. PATENT DOCUMENTS

| 8,106,583 | B2 | 1/2012 | Shin et al. |
| 8,519,612 | B2 | 8/2013 | Yoon et al. |
| 2014/0159001 | A1 | 6/2014 | Park et al. |
| 2014/0346473 | A1 | 11/2014 | Park et al. |
| 2015/0021583 | A1 | 1/2015 | Yamazaki et al. |
| 2015/0221619 | A1 | 8/2015 | Rhee |
| 2016/0181338 | A1* | 6/2016 | Heo ................. H01L 51/0097 257/40 |

FOREIGN PATENT DOCUMENTS

| KR | 10-2010-0102380 | 9/2010 |
| KR | 10-2011-0059966 | 6/2011 |
| KR | 10-2014-0137950 | 12/2014 |
| KR | 10-2016-0017435 | 2/2016 |

* cited by examiner

*Primary Examiner* — William Harriston
(74) *Attorney, Agent, or Firm* — Lee & Morse, P.C.

(57) ABSTRACT

A display device includes a substrate including a first plastic layer, a second plastic layer on the first plastic layer, and a black organic layer between the first and second plastic layers, a buffer layer on the substrate, a thin film transistor on the buffer layer, and a plurality of display elements electrically, at least one of the display elements being connected to the thin film transistor, the display elements respectively being arranged in a plurality of pixels.

19 Claims, 8 Drawing Sheets

DISPLAY DEVICE

CROSS-REFERENCE TO RELATED APPLICATION

Korean Patent Application No. 10-2016-0114451, filed on Sep. 6, 2016, in the Korean Intellectual Property Office, and entitled: "Display Device," is incorporated by reference herein in its entirety.

BACKGROUND

1. Field

One or more embodiments relate to a display device.

2. Description of the Related Art

An organic light-emitting display device has a self-luminous characteristic and may be used without a separate light source. Thus, the organic light-emitting display device may have a reduced thickness and weight. Also, the organic light-emitting display device may exhibit high quality characteristics such as low power consumption, high brightness, and high response speeds.

SUMMARY

Embodiments are directed to a display device, including a substrate including a first plastic layer, a second plastic layer on the first plastic layer, and a black organic layer between the first and second plastic layers, a buffer layer on the substrate, a thin film transistor on the buffer layer, and a plurality of display elements, at least one of the display elements being electrically connected to the thin film transistor, the display elements respectively being arranged in a plurality of pixels.

The first and second plastic layers may be flexible.

The substrate may further include an inorganic layer between the first and second plastic layers.

The inorganic layer may include at least one of amorphous silicon, silicon oxide, and silicon nitride.

The black organic layer may contact at least one of the first and second plastic layers.

A thickness of the black organic layer may be smaller than those of the first and second plastic layers.

The black organic layer may have a thickness of about 5 µm or less.

The display device may further include: a light shield on the plurality of display elements.

The light shield may be arranged in every adjacent pixel from among the plurality of pixels.

The display device may further include: an encapsulation layer including at least one organic layer and at least one inorganic layer, the encapsulation layer being between the plurality of display elements and the light shield.

The display device may further include: a color filter between light shields.

The black organic layer may be one body and may correspond to the plurality of pixels.

The buffer layer may include an inorganic material.

The thin film transistor may include a semiconductor layer and a gate electrode overlapping a channel region of the semiconductor layer.

One of the semiconductor layer and the gate electrode may be directly on the buffer layer.

Each of the plurality of display elements may include: a pixel electrode electrically connected to the thin film transistor; an intermediate layer on the pixel electrode and including an emission layer; and an opposite electrode on the intermediate layer.

The plurality of display elements may include a first display element of a first color and a second display element of a second color, and a distance between a pixel electrode of the first display element and an opposite electrode may be different from a distance between a pixel electrode of the second display element and an opposite electrode.

The display device may further include a capping layer on the opposite electrode; and a reflection prevention auxiliary layer on the opposite electrode with the capping layer provided therebetween.

The reflection prevention auxiliary layer may include at least one of Ti, Mo, and Mn.

Light reflected by the opposite electrode may destructively interfere with light reflected by the reflection prevention auxiliary layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
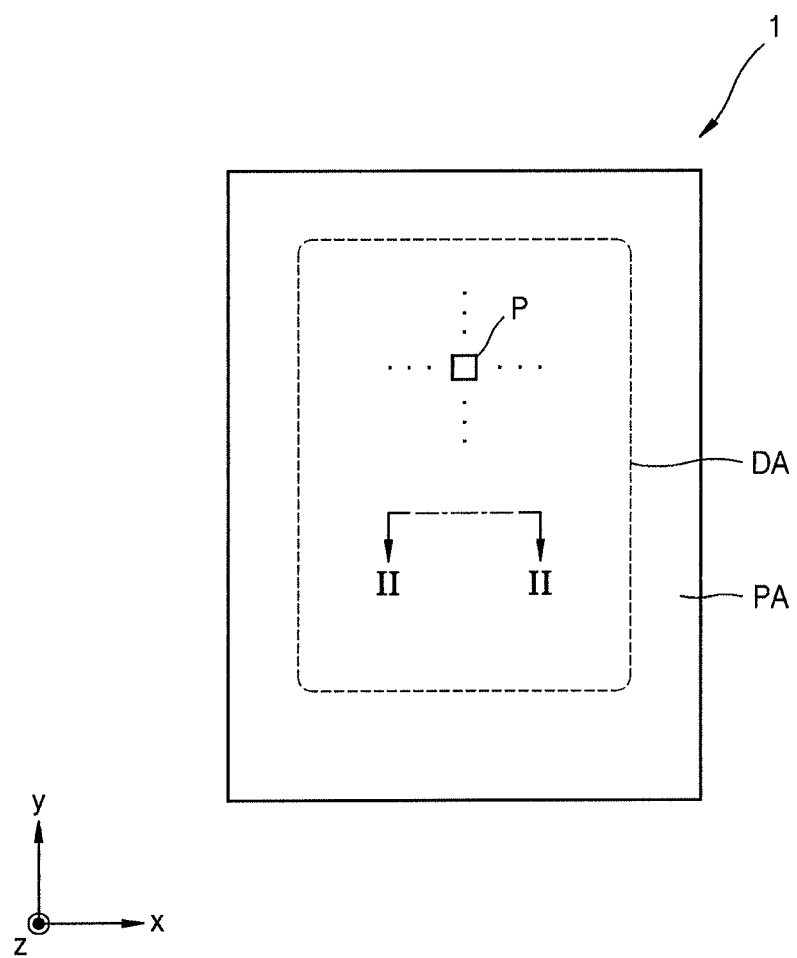
FIG. 1 illustrates a plan view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

As used herein, the term "and/or" includes any and all combinations of one or more of the associated listed items.

It will be understood that although the terms "first", "second", etc. may be used herein to describe various components, these components should not be limited by these terms. These components are only used to distinguish one component from another.

As used herein, the singular forms "a" "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to the other layer, region, or component with another layer, region, or component interposed therebetween.

FIG. 1 is a plan view of a display device 1 according to an embodiment.

Referring to FIG. 1, the display device 1 includes a display area DA and a peripheral area PA, which is a non-display area that does not provide an image. Pixels P having a display element (such as an organic light-emitting diode (OLED)) are in the display area DA and provide a predetermined image. The peripheral area PA may include drivers such as a scan driver and a data driver, transferring an electric signal and power to be applied to the pixels P of the display area DA, signal lines such as a scan line and a data line, and power lines such as a driving voltage ELVDD line and a common voltage ELVSS line providing power.

Figure 2:
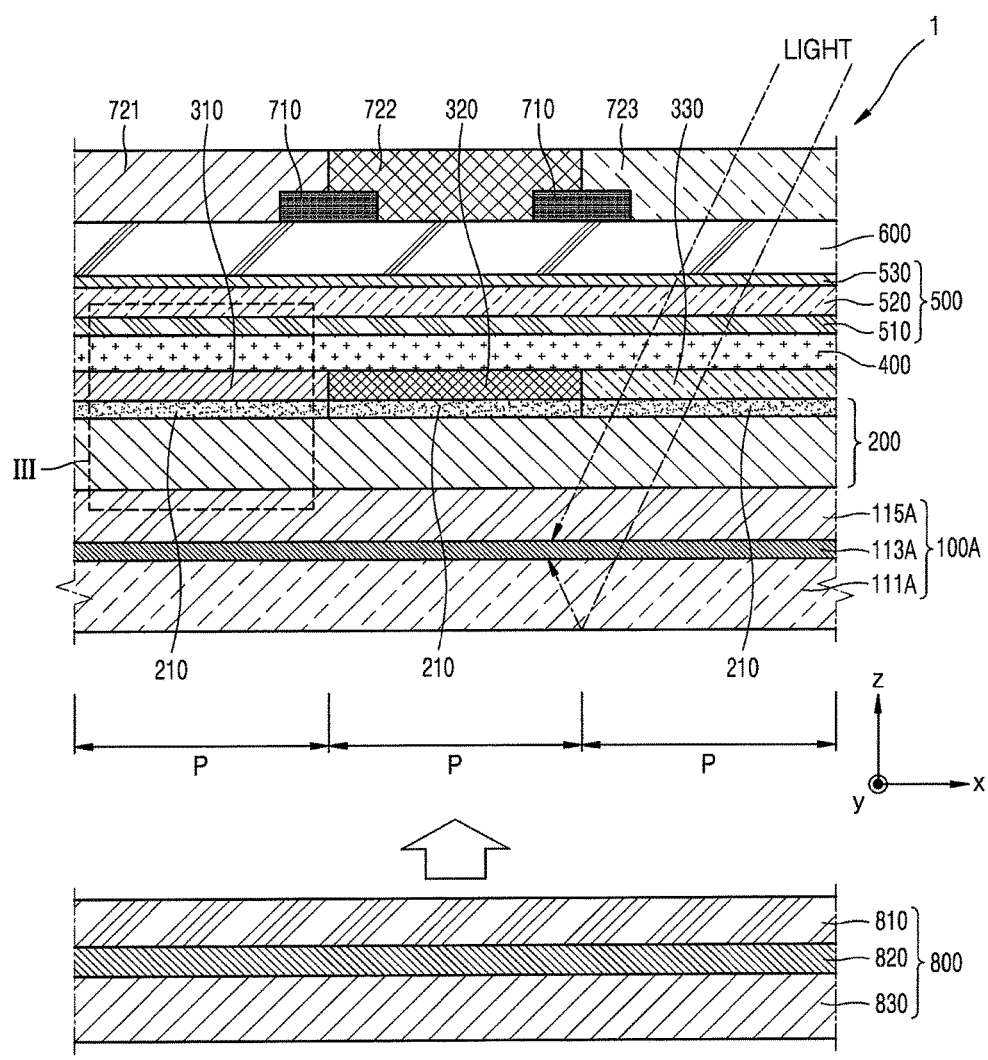
FIG. 2 illustrates a cross-sectional view of the display device taken along a line II-II of FIG. 1.
Figure 3A:
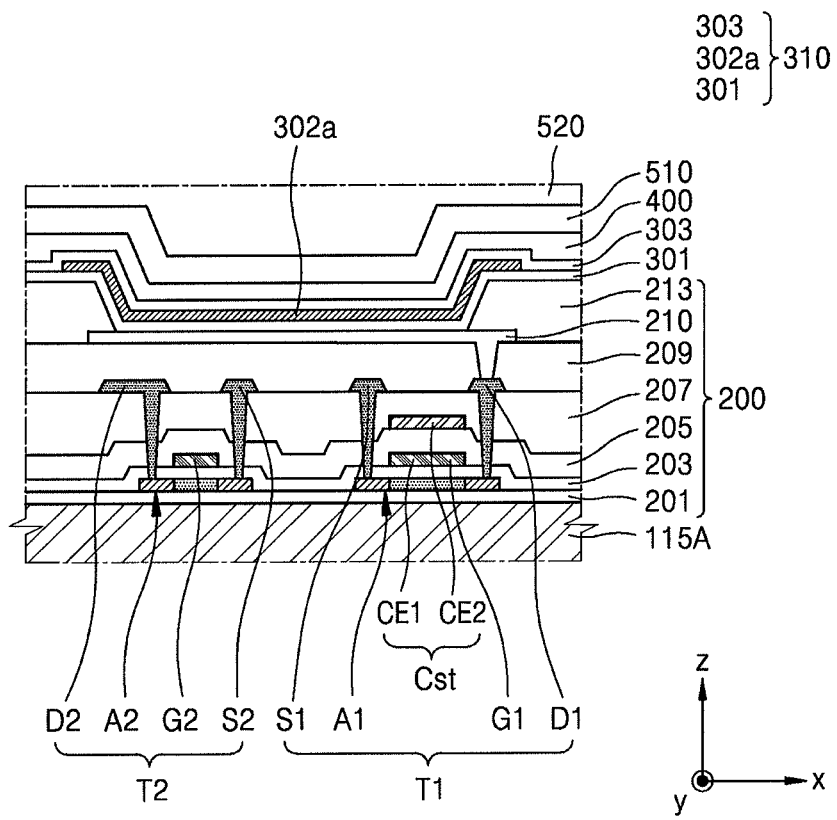
FIGS. 3A and 3B illustrate cross-sectional views of a circuit element layer, an intermediate layer, and an opposite electrode according to an embodiment and correspond to a portion III of the display device of FIG. 2.
Figure 3B:
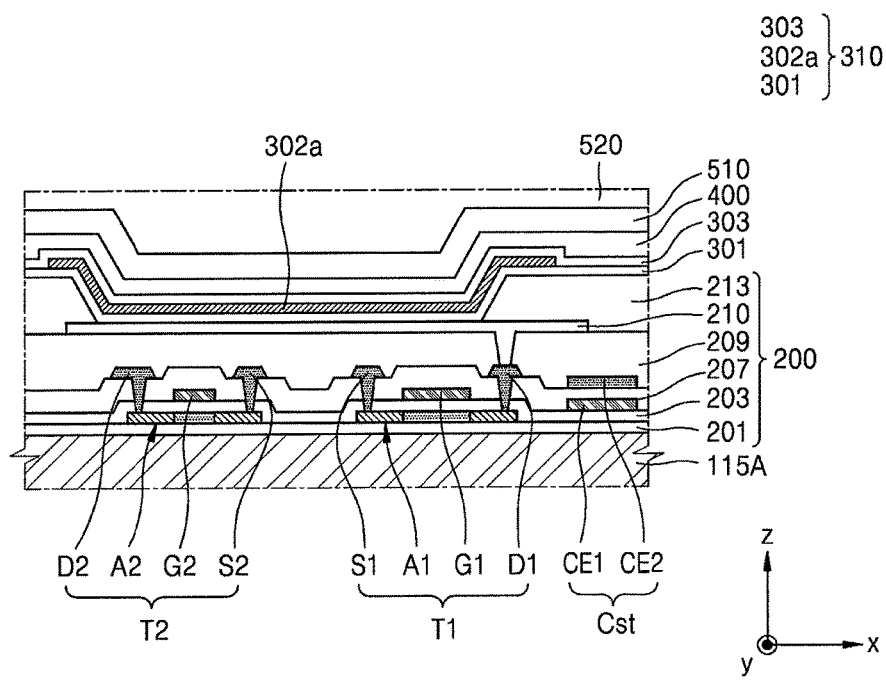

FIG. 2 is a cross-sectional view of the display device 1 taken along a line II-II of FIG. 1, and FIGS. 3A and 3B are cross-sectional views of a circuit element layer, an intermediate layer, and an opposite electrode according to an embodiment and correspond to a portion III of the display device 1 of FIG. 2.

Referring to FIG. 2, a substrate 100A of the display device 1 has a flexible characteristic such that it may be, for example, folded or rolled up. According to the present example embodiment, the substrate 100A includes flexible first and second plastic layers 111A and 115A, and a black organic layer 113A therebetween.

The first and second plastic layers 111A and 115A may include, for example, polyimide (PI), polyethersulphone (PES), polyacrylate (PAR), polyether imide (PEI), polyethyelenen naphthalate (PEN), polyethyleneterephthalate (PET), polyphenylene sulfide (PPS), polyallylate, polycarbonate (PC), triacetylcellulose (TAC), cellulose acetate propionate (CAP), cyclic olefin polymer, cyclic olefin copolymer, etc.

The first and second plastic layers 111A and 115A may be plate-shaped layers having a predetermined thickness and have a flexible characteristic. The first and second plastic layers 111A and 115A may have a thickness ranging from, for example, about 3 μm to about 50 μm. In an example embodiment, the first and second plastic layers 111A and 115A may have a thickness ranging from about 3 μm to about 20 μm. In an example embodiment, the first and second plastic layers 111A and 115A may have a thickness ranging from about 5 μm to about 10 μm. In the case where the first and second plastic layers 111A and 115A have a thickness deviating from a minimum value of the above-mentioned range, the reliability of the substrate 100A may be reduced. Also, in the case where the first and second plastic layers 111A and 115A have a thickness deviating from a maximum value of the above-mentioned range, a flexible characteristic may be reduced and the amount of light absorbed in the black organic layer 113A may be reduced.

The thicknesses of the first and second plastic layers 111A and 115A may be selected variously within the above-described range. The thicknesses of the first and second plastic layers 111A and 115A may be the same or different thicknesses may be selected. By taking into account an absorption rate by which light incident to the display device 1 from outside and passing through the second plastic layer 115A is absorbed in the black organic layer 113A, the second plastic layer 115A may have a thickness less than that of the first plastic thickness 111A.

According to the present example embodiment, the black organic layer 113A includes an organic material having a light absorption characteristic. The black organic layer 113A may include, for example, an organic material in which carbon black or black dyes are mixed. For example, the black organic layer 113A may include carbon black or black dyes or pigments, a binder resin, a polymer monomer, a photopolymerization initiator, etc.

The black organic layer 113A may be one body, for example, a single continuous body, corresponding to a plurality of pixels P. In an example embodiment, the black organic layer 113A may not include a plurality of regions discontinuous in an x-direction but may be continuous in the x-direction to cover the plurality of pixels P. The black organic layer 113A absorbs light incident from outside.

Light, which is transmitted via a light shield 710 and color filters 721, 722, and 723 from outside and is incident into the display device 1, may be reflected by layers of the display device 1 and thus may be visible to outside, which may reduce display quality. According to an example embodiment, the black organic layer 113A between the first and second plastic layers 111A and 115A absorbs light incident into the display device 1, such that light progressing toward the outside of the display device 1 may be reduced or blocked, that is, the reflectivity of external light of the display device 1 may be reduced, and display quality may improve.

The black organic layer 113A may directly contact the first and second plastic layers 111A and 115A. For example, one side of the black organic layer 113A may contact the first plastic layer 111A, and the opposite side of the black organic layer 113A may contact the second plastic layer 115A. The first and second plastic layers 111A and 115A and the black organic layer 113A may include an organic material. Thus, binding force between these layers may be stronger than binding force between an inorganic layer and each of these layers. Therefore, in the case where the display device 1 is bent or rolled, tolerance of stress applied to the substrate 100A may be improved and durability of the display device 1 may improve.

In an example embodiment, the black organic layer 113A may have a thickness less than those of the first and second plastic layers 111A and 115A. A maximum thickness of the black organic layer 113A may be, for example, about 5 μm. In an example embodiment, the black organic layer 113A may have a thickness ranging from, for example, about 1 μm to about 5 μm, which may help prevent transmission of external foreign substances (for example, moisture) via the substrate 100A.

The substrate 100A may further include a conductive material layer between the first and second plastic layers 111A and 115A. The conductive material layer may include, for example, metal, a conductive polymer, or a transparent conductive oxide (TCO) layer such as ITO, IZO, ZnO, In$_2$O$_3$, IGO, or AZO. The conductive material layer may be a single layer or multiple layers including the above-described material(s).

The circuit element layer 200 may include a pixel electrode 210 in each pixel P. Intermediate layers 310, 320, and 330, and an opposite electrode 400 may be on the pixel electrode 210.

The intermediate layers 310, 320, and 330 may include an emission layer emitting light of different colors for each pixel P. For example, the intermediate layer 310 (referred to as a first intermediate layer, hereinafter) may include an emission layer including an organic material emitting red light. The other intermediate layer 320 (referred to as a second intermediate layer, hereinafter) may include an emission layer including an organic material emitting green light. The other intermediate layer 330 (referred to as a third intermediate layer, hereinafter) may include an emission layer including an organic material emitting blue light. Each of the first to third intermediate layers 310, 320, and 330 may further include one or more of a hole transport layer (HTL), a hole injection layer (HIL), an electron transport layer (ETL), or an electron injection layer (EIL) in addition to the emission layer emitting light.

The pixel electrode 210, the first intermediate layer 310, and the opposite electrode 400 may form one OLED. When a hole and an electron respectively injected from the pixel electrode 210 and the opposite electrode 400 recombine in the first intermediate layer 310, for example, the emission layer, an exciton is generated. While the exciton falls from an excited state to a ground state, the exciton emits red light. Likewise, the pixel electrode 210, the second intermediate layer 320, and the opposite electrode 400 form one OLED and emit green light. The pixel electrode 210, the third intermediate layer 330, and the opposite electrode 400 form one OLED and emit blue light. The circuit element layer 200 includes a circuit applying a signal and a voltage to the above-described OLEDs.

Referring to FIG. 3A, the circuit element layer 200 may include a driving thin film transistor T1, a switching thin film transistor T2, a storage capacitor Cst, and the pixel electrode 210 electrically connected to these.

The driving thin film transistor T1 may include a driving semiconductor layer A1, a driving gate electrode G1, a driving source electrode S1, and a driving drain electrode D1. The switching thin film transistor T2 may include a switching semiconductor layer A2, a switching gate electrode G2, a switching source electrode S2, and a switching drain electrode D2. The storage capacitor Cst may include first and second storage plates CE1 and CE2.

A buffer layer 201 may be between the second plastic layer 115A and the driving and switching semiconductor layers A1 and A2. A gate insulating layer 203 may be between the driving and switching semiconductor layers A1 and A2 and the driving and switching gate electrodes G1 and G2. A dielectric layer 205 may be between the first and second storage plates CE1 and CE2. An interlayer insulating layer 207 may be between the driving and switching gate electrodes G1 and G2 and the driving and switching source/drain electrodes S1, D1, S2, and D2. An insulating layer 209 may be below the pixel electrode 210.

The buffer layer 201 and the gate insulating layer 203 may be a single layer or multiple layers including an inorganic material such as SiN$_x$ and/or SiO$_x$. The dielectric layer 205 and the interlayer insulating layer 207 may be a single layer or multiple layers including an inorganic material such as SiO$_x$, SiN$_x$, and/or Al$_2$O$_3$. The insulating layer 209 may include, for example, an organic material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, a blend thereof, etc.

The pixel electrode 210 is on the insulating layer 209, which may be a planarization layer. The pixel electrode 210 may be, for example, a TCO layer, or a metallic thin layer including Ag or an Ag alloy, or may be multiple layers including a TCO layer on the metallic thin layer. In an example embodiment, the pixel electrode 210 may be a triple layer of ITO/Ag/ITO sequentially having thicknesses of about 70 Å/850 Å/50 Å.

A pixel-defining layer 213 may expose the pixel electrode 210 while covering the edge of the pixel electrode 210. The pixel-defining layer 213 may include an organic insulating material and an inorganic insulating material, or include only an organic insulating material, or include only an inorganic insulating material.

An emission layer 302a of the first intermediate layer 310 may include an organic material emitting red light and may overlap a portion of the pixel electrode 210 that is exposed by the pixel-defining layer 213. First and second intermediate functional layers 301 and 303 may be below and/or above the emission layer 302a.

The first intermediate functional layer 301 may be between the pixel electrode 210 and the emission layer 302a. The first intermediate functional layer 301 may include, for example, an HTL and an HIL. The second intermediate functional layer 303 may be between the emission layer 302a and the opposite electrode 400. The second intermediate functional layer 303 may include, for example, an ETL and an EIL.

The emission layer 302a and the first and second intermediate functional layers 301 and 303 may include a low molecular organic material or a polymer material. In the case where the emission layer 302a and the first and second intermediate functional layers 301 and 303 include a low molecular organic material, they may include various organic materials such as copper phthalocyanine (CuPc), N,N'-Di(naphthalene-1-yl)-N,N'-diphenyl-benzidine (NPB), and tris-8-hydroxyquinoline aluminum (Alq3). In the case where they include a polymer material, the first intermediate functional layer 301 may include an HTL. The HTL may include, for example, PEDOT, and the emission layer 302a may include, for example, a polymer material such as a polyfluorene-based material.

The opposite electrode 400 may be one body to entirely cover the substrate 100A. The opposite electrode 400 may be, for example, a semi-transmissive metallic thin layer including a metal having a small work function such as Li, Ca, LiF/Ca, LiF/Al, Al, Mg, Ag, an alloy of Ag and Mg, etc. In another implementation, the opposite electrode 400 may include the semi-transmissive metallic thin layer and a TCO layer such as ITO, IZO, ZnO, In$_2$O$_3$, IGO, or AZO on the semi-transmissive metallic thin layer.

FIG. 3A illustrates a structure in which the storage capacitor Cst of the circuit element layer 200 overlaps the driving thin film transistor T1 among the driving and switching thin film transistors T1 and T2. Although FIG. 3A illustrates that the driving gate electrode G1 serves as the first storage plate CE1 other configurations may be used.

Referring to FIG. 3B, the storage capacitor Cst may not overlap the driving thin film transistor T1. For example, the first storage plate CE1 and the driving gate electrode G1 may include the same material, the second storage plate CE2 may include the same material as those of the driving source and drain electrodes S1 and D1, and the gate insulating layer 203 may be between the first and second storage plates CE1 and CE2.

Although the embodiments described with reference to FIGS. 3A and 3B describe the case where the driving and switching gate electrodes G1 and G2 of the driving and switching thin film transistors T1 and T2 are above the driving and switching semiconductor layers A1 and A2, other configurations may be used. In another embodiment, the driving and switching gate electrodes G1 and G2 may be respectively below the driving and switching semiconductor layers A1 and A2. Depending on the locations of the driving and switching gate electrodes G1 and G2, in other embodiments, the driving and switching semiconductor layers A1 and A2 may be right above the buffer layer 201, and in other embodiments, the driving and switching gate electrodes G1 and G2 may be right above the buffer layer 201.

Although a pixel P having the first intermediate layer 310 has been mainly described with reference to FIGS. 3A and 3B, a pixel P having the second and third intermediate layers 320 and 330 may have the same structure. Since the descriptions thereof are the same as those described above, repeated descriptions will be omitted.

Referring to FIG. 2 again, an encapsulation layer 500 is above the opposite electrode 400. The encapsulation layer 500 may include at least one inorganic layer and at least one organic layer. For example, the encapsulation layer 500 may include a first inorganic layer 510, a second inorganic layer 530, and an organic layer 520 between the first and second inorganic layers 510 and 530.

The first and second inorganic layers 510 and 530 may include, for example, AlN, $Al_2O_3$, TiN, $TiO_2$, SiON, $SiN_x$, $SiO_x$, etc. The first and second inorganic layers 510 and 530 may protect the opposite electrode 400 and first to third intermediate layers 310, 320, and 330 from moisture.

The organic layer 520 may include a polymer-based material such as polymethylmethacrylate (PMMA), polycarbonate (PC), polystyrene (PS), an acryl-based polymer, an epoxy-based polymer, polyimide (PI), and polyethylene (PE). The organic layer 520 may be thicker than the first and second inorganic layers 510 and 530. The organic layer 520 may relieve internal stress of the first and second inorganic layers 510 and 530, supplement for any defects of the first and second inorganic layers 510 and 530, and planarize the first and second inorganic layers 510 and 530.

A functional layer 600 may be on the encapsulation layer 500. The functional layer 600 may be, for example, an optical functional layer including a lens and/or a plurality of layers having different refractive indexes. In another implementation, the functional layer 600 may be, for example, a touch electrode layer including electrodes recognizing a touch input.

A light shield 710 may be on the encapsulation layer 500, for example, on the functional layer 600. The light shield 710 may include a light-absorbing material such as carbon black and may be provided between adjacent pixels P. The light shield 710 may absorb light which is reflected from the inside of the display device 1 but which does not reach the organic layer 113A, which may help prevent the light from progressing to outside. Therefore, the light shield 710 may help reduce reflectivity of external light and improve contrast.

Color filters 721, 722, and 723 may be arranged at locations corresponding to a pixel between the light shields 710. One color filter 721 (referred to as a first color filter, hereinafter) may be a red color filter, another color filter 722 (referred to as a second color filter, hereinafter) may be a green color filter, and another color filter 723 (referred to as a third color filter, hereinafter) may be a blue color filter. When light is incident from outside to the first to third color filters 721, 722, and 723, only a very small amount of light from among the incident light may be reflected by the first to third color filters 721, 722, and 723. Therefore, visibility may improve and definition may improve.

In the case of using the light shield 710 and the first to third color filters 721, 722, and 723, a reflection prevention performance of external light may be equal to or less than a case of using a polarizing plate. According to an embodiment, the black organic layer 113A is between the first and second plastic layers 111A and 115A of the substrate 100A. Thus, reflectivity of external light may be reduced even more compared with a case of using the polarization plate. Also, in the case of using the polarization plate, the brightness of light emitted from the first to third intermediate layers 310, 320, and 330 may be reduced. According to an embodiment, reduction in the brightness of light may not occur.

A backside film 800 may be on the backside of the substrate 100A, for example, the opposite side of the circuit element layer 200. The backside film 800 may include, for example, a backside protective layer 810, a black layer 820, and a buffer layer 830. The backside film 800 may be attached to the backside of the substrate 100A by using an adhesive or an adhesive tape, etc. In an example embodiment, the backside protective layer 810 may include PET. The black layer 820 may include black ink. The buffer layer 830 may include a polymer resin material.

Figure 4:
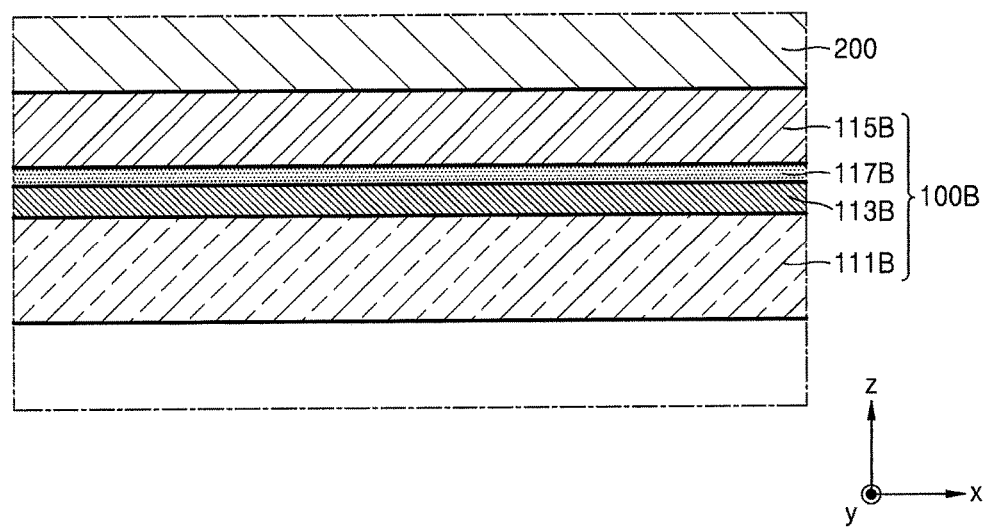
FIGS. 4 to 6 illustrate cross-sectional views of a substrate of a display device according to another embodiment.
Figure 5:
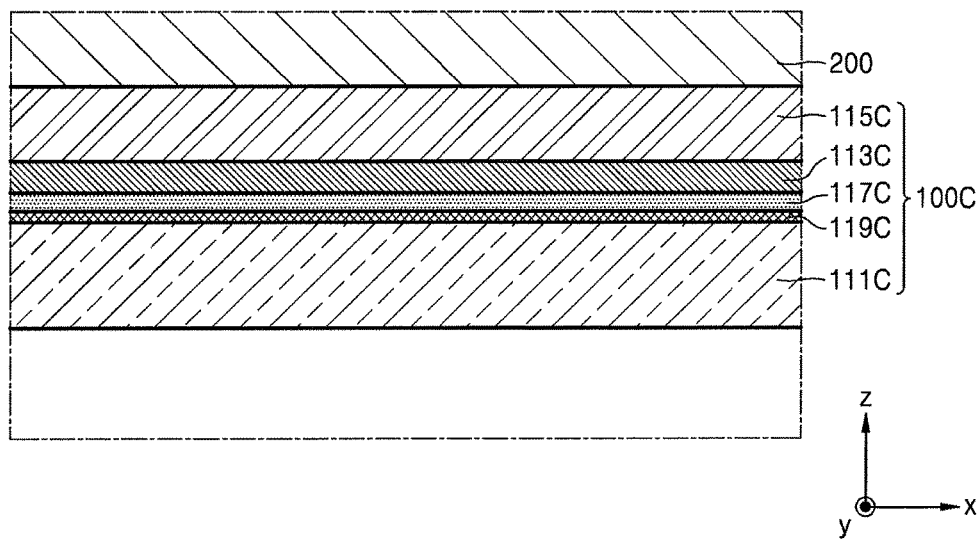
Figure 6:
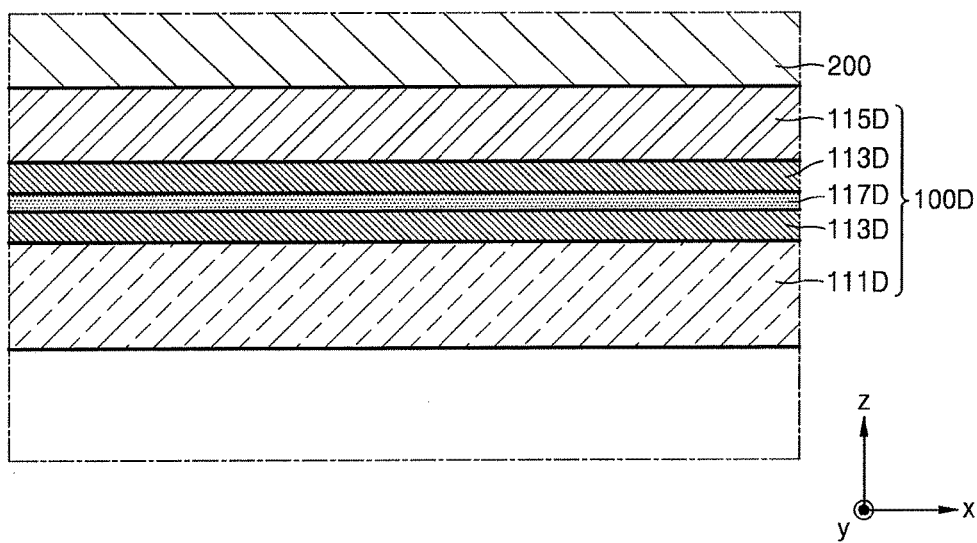

FIGS. 4 to 6 are cross-sectional views of a substrate of a display device according to another embodiment.

Referring to FIG. 4, a substrate 100B may include first and second plastic layers 111B and 115B and a black organic layer 113B and an inorganic layer 117B between the first and second plastic layers 111B and 115B. Since the first and second plastic layers 111B and 115B and the black organic layer 113B are the same as the first and second plastic layers 111A and 115A and the black organic layer 113A described above, differences are mainly described below.

The inorganic layer 117B is an inorganic barrier layer and may prevent external foreign substances such as moisture from penetrating via the substrate 100B. The inorganic layer 117E may be, for example, a single layer or multiple layers including an inorganic material such as $SiN_x$ and/or $SiO_x$. In an example embodiment, the inorganic layer 117B may have a thickness of, for example, about 6000 Å. In the case where the substrate 100B further includes the inorganic layer 117B, the black organic layer 113B may have a thickness thinner than the thickness described with reference to FIG. 2.

Although FIG. 4 illustrates a case where the inorganic layer 117B is between the black organic layer 113B and the second plastic layer 115B, other configurations may be used.

Referring to FIG. 5, a substrate 100C may include first and second plastic layers 111C and 115C, and a black organic layer 113C and an inorganic layer 117C between the first and second plastic layers 111C and 115C, and an additional inorganic layer 119C. Since the first and second plastic layers 111C and 115C, and the black organic layer 113C are the same as the first and second plastic layers 111A and 115A, and the black organic layer 113A described above and the inorganic layer 117C are the same as the inorganic layer 117B described above, differences are mainly described below.

The inorganic layer 117C may be below the black organic layer 113C, for example, between the black organic layer 1130 and the first plastic layer 111C. The inorganic layer 117C may be a single layer or multiple layers including $SiN_x$ and/or $SiO_x$ as described above. In an example embodiment, the inorganic layer 117C may have a thickness of, for example, about 6000 Å.

The additional inorganic layer 119C is between the first plastic layer 111C and the inorganic layer 117C and may improve adhesive force therebetween. The additional inorganic layer 119C may include an inorganic material such as amorphous silicon. The additional inorganic layer 119C may have a thickness, for example, ranging from about 10 Å to about 20 Å. In an example embodiment, the additional inorganic layer 119C may have a thickness of, for example, about 15 Å.

Although FIGS. 4 and 5 illustrate a case where the black organic layers 113B and 113C are single layers, other configurations may be used.

Referring to FIG. 6, a substrate 100D may include first and second plastic layers 111D and 115D, black organic layers 113D between the first and second plastic layers 111D and 115D, and an inorganic layer 117D between the black organic layers 113D. Since the first and second plastic layers 111D and 115D are the same as the first and second plastic layers 111A and 115A described above, differences are mainly described below.

The black organic layers 113D may be respectively on the first plastic layer 111A and below the second plastic layer 115A. The black organic layer 113D includes the same material described above. The inorganic layer 117D may be between the black organic layers 113D. The inorganic layer 117D is an inorganic barrier layer and may be a single layer or multiple layers including an inorganic material such as $SiN_x$ and/or $SiO_x$ as described above.

The black organic layers 113A, 113B, 113C, and 113D may be single layers or multiple layers and may be provided to the substrates 100A, 100B, 100C, and 100D. The black organic layers 113A, 113B, 113C, and 113D may improve binding force between layers forming the substrates 100A, 100B, 100C, and 100D and simultaneously prevent reflection of external light as described above, and may contact at least one of the first and second plastic layers 111A, 115A, 111B, 115B, 111C, 115C, 111D, and 115D.

Figure 7:
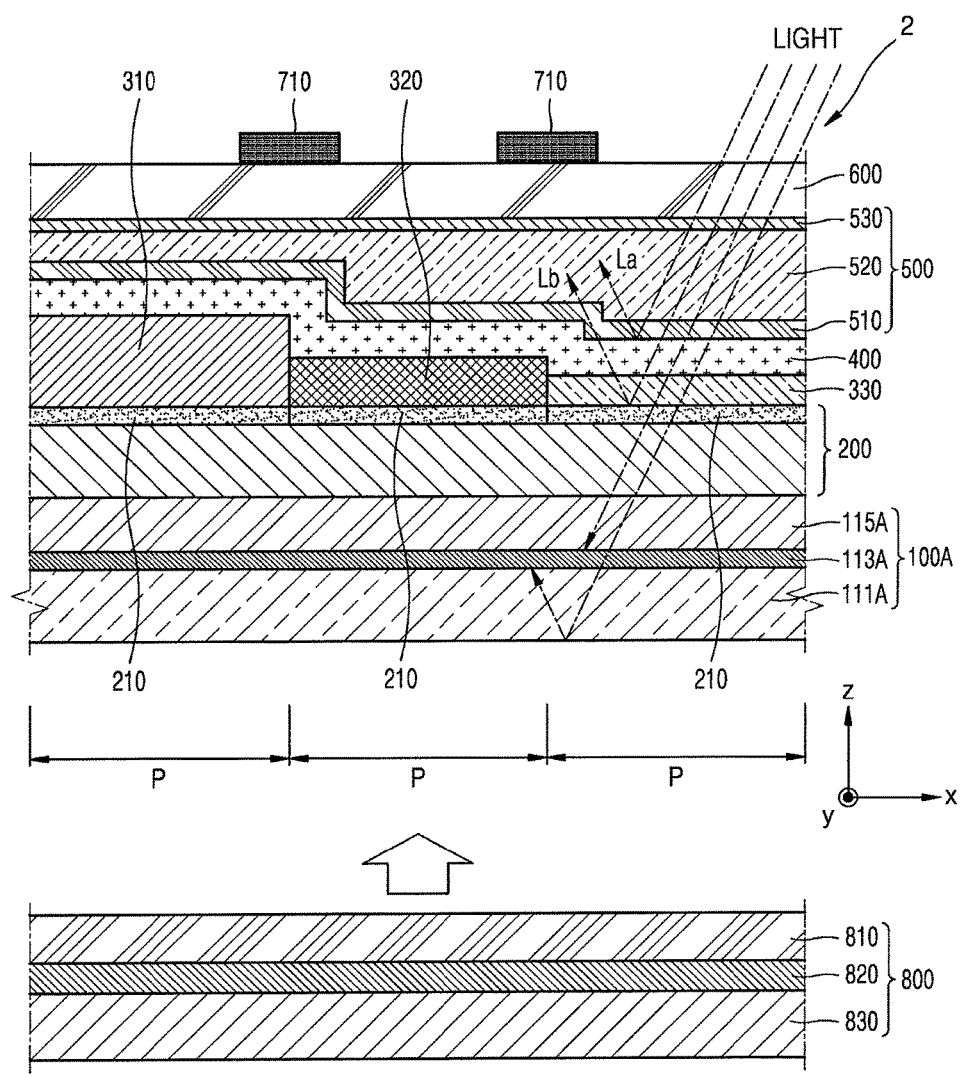
FIG. 7 illustrates a cross-sectional view of a display device according to another embodiment.

FIG. 7 is a cross-sectional view of a display device 2 according to another embodiment.

Referring to FIG. 7, the display device 2 may include the substrate 100A, the circuit element layer 200, the intermediate layers 310, 320, and 330, the opposite electrode 400, the encapsulation layer 500, the functional layer 600, the light shield 710, and the backside film 800. The substrate 100A, the circuit element layer 200, the intermediate layers 310, 320, and 330, the opposite electrode 400, the encapsulation layer 500, the functional layer 600, the light shield 710, and the backside film 800 of the display device 2 are the same described above, descriptions thereof are omitted and differences are mainly described below.

The first to third intermediate layers 310, 320, and 330 of each pixel P of the display device 2 may have different thicknesses. The thicknesses of the first to third intermediate layers 310, 320, and 330 may be determined by the wavelengths of light respectively emitted from the first to third intermediate layers 310, 320, and 330, and the refractive indexes of the first to third intermediate layers 310, 320, and 330. Each of the first to third intermediate layers 310, 320, and 330 may perform a reflection prevention function of external light by forming a micro cavity structure with the opposite electrode 400. For example, as illustrated in FIG. 7, a portion of light incident from outside may be reflected by the opposite electrode 400, and light which has passed through the opposite electrode 400 may pass through the third intermediate layer 330 and may be reflected by the pixel electrode 210. Since light La reflected by the opposite electrode 400 and light Lb reflected by the pixel electrode 210 destructively interfere with each other, light visible to the outside of the display device 2 may reduce, that is, reflectivity of external light may be reduced.

External light may undergo destructive interference due to the above-described micro cavity structure, but light respectively emitted from the first to third intermediate layers 310, 320, and 330 may undergo constructive interference and may improve light efficiency of the display device 2.

Light incident up to the substrate 100A from among light incident to the display device 2 may be absorbed by the black organic layer 113A, and light reflected by other layers may be absorbed by the light shield 710 as described above.

Although FIG. 7 illustrates that the substrate 100A includes the first and second plastic layers 111A and 115A and the black organic layer 113A therebetween, other configurations may be used. As described with reference to FIGS. 4 to 6, the substrates 100B, 100C, and 100D of the display device 2 may have various structures.

Figure 8:
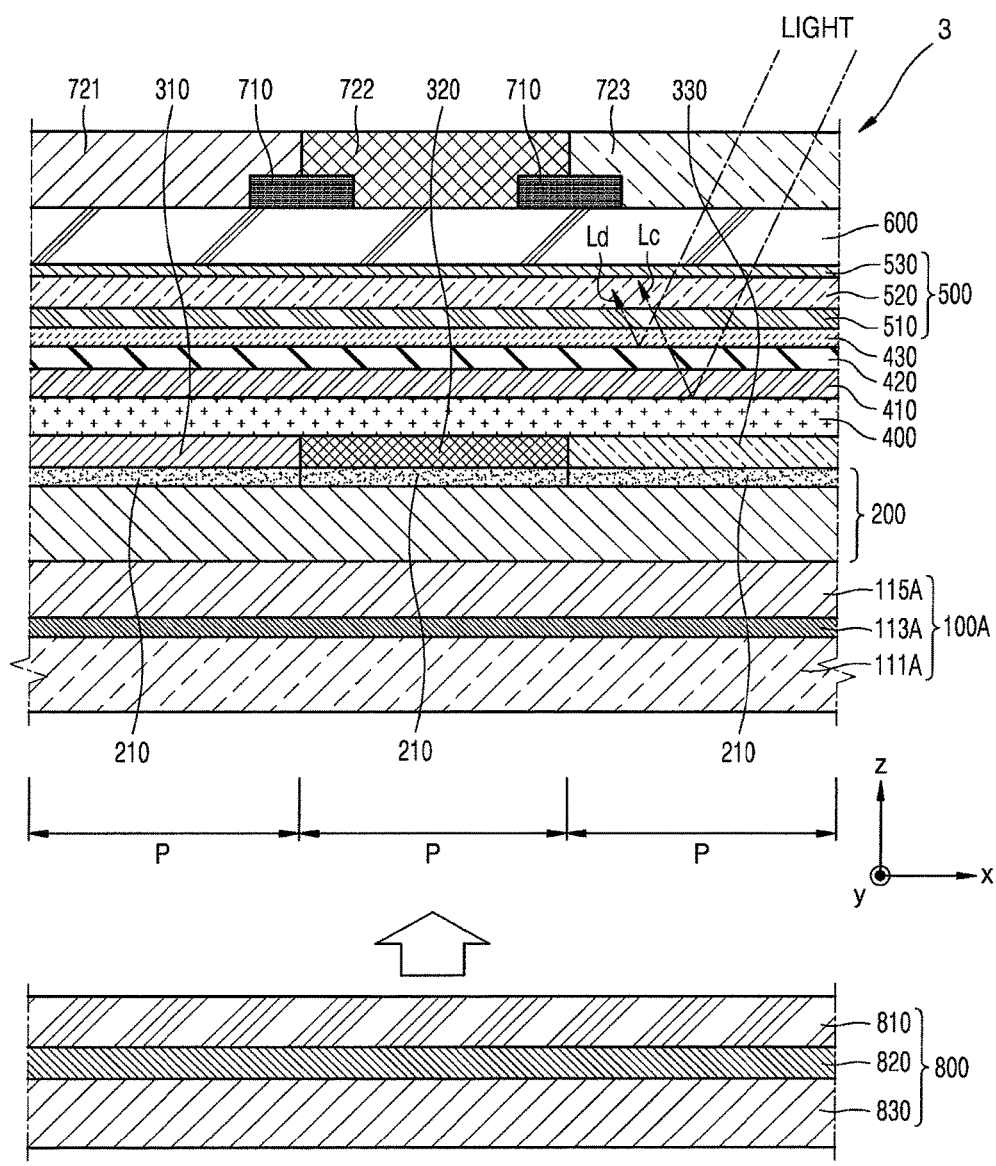
FIGS. 8 and 9 illustrate cross-sectional views of a display device according to another embodiment.
Figure 9:
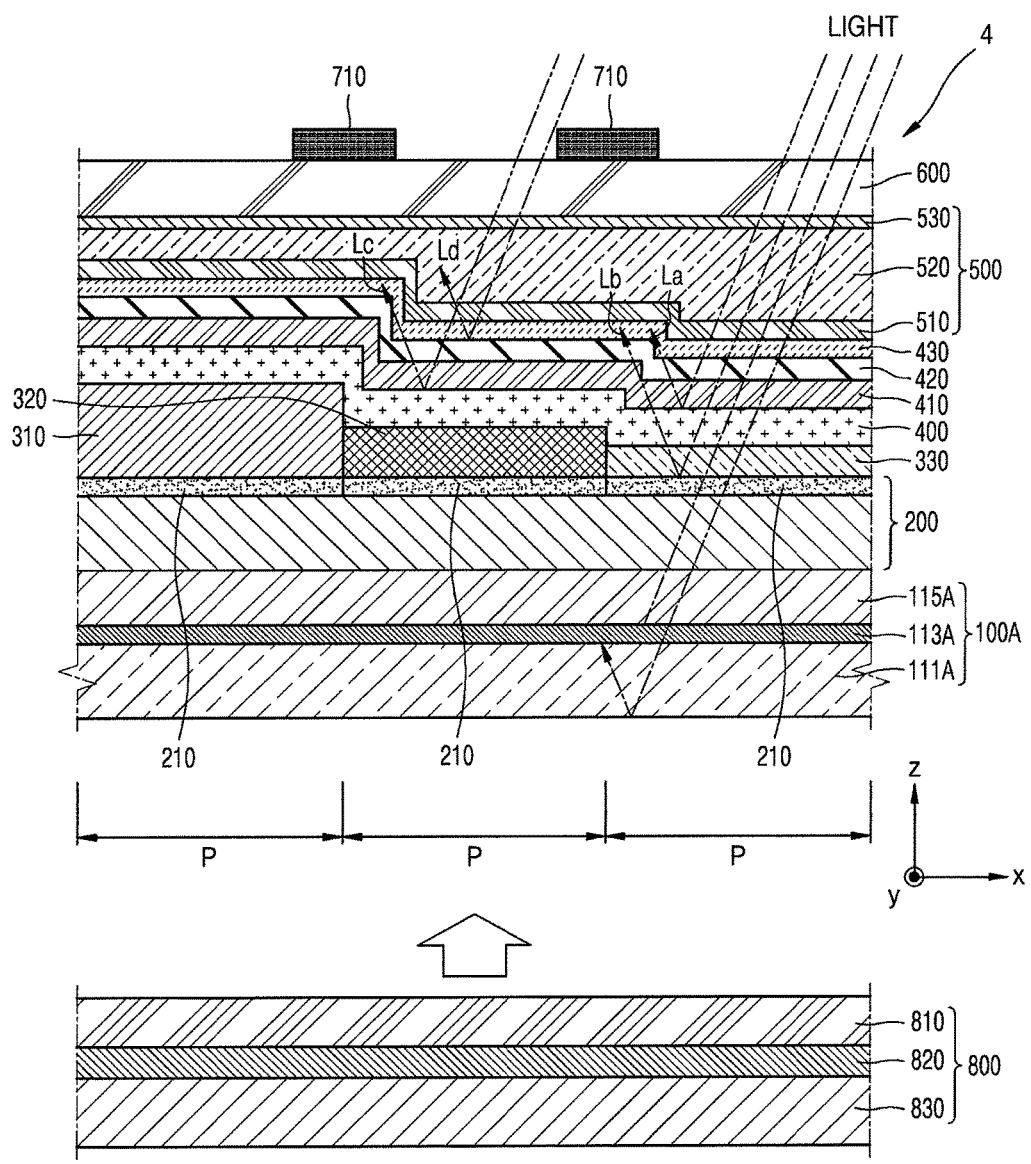

FIGS. 8 and 9 are cross-sectional views of a display device 3 (4) according to another embodiment.

Referring to FIG. 8, the display device 3 may include the substrate 100A, the circuit element layer 200, the first to third intermediate layers 310, 320, and 330, the opposite electrode 400, the encapsulation layer 500, the functional layer 600, the light shield 710, the color filters 721, 722, and 723, and the backside film 800. The substrate 100A, the circuit element layer 200, the first to third intermediate layers 310, 320, and 330, the opposite electrode 400, the encapsulation layer 500, the functional layer 600, the light shield 710, the color filters 721, 722, and 723, and the backside film 800 of the display device 3 are the same as those described with reference to FIGS. 2 to 3B. Referring to FIG. 9, the display device 4 may include the substrate 100A, the circuit element layer 200, the first to third intermediate layers 310, 320, and 330, the opposite electrode 400, the encapsulation layer 500, the functional layer 600, the light shield 710, and the backside film 800. The structures thereof are the same as those of the display device 2 described with reference to FIG. 7. Therefore, descriptions thereof are the same described above and differences are mainly described below.

As illustrated in FIG. 8, the display device 3 may further include a capping layer 410 and a reflection prevention auxiliary layer 420 between the opposite electrode 400 and the encapsulation layer 500.

The capping layer 410 may protect layers below the capping layer 410, for example, the opposite electrode 400 and the first to third intermediate layers 310, 320, and 330. The capping layer 410 may be a single layer or multiple layers including an organic material and/or an inorganic material and may have a thickness ranging from about 650 Å to about 850 Å.

The reflection prevention auxiliary layer 420 is on the capping layer 410. The reflection prevention auxiliary layer 420 may be, for example, a semi-transmissive layer that may transmit light emitted from the first to third intermediate layers 310, 320, and 330 and reflect external light. The reflection prevention auxiliary layer 420 may include, for example, one of Ti, Mo, and Mn. The reflection prevention auxiliary layer 420 may have a thickness, for example, ranging from about 100 Å to about 300 Å. In an example embodiment, the reflection prevention auxiliary layer 420 may have a thickness of, for example, about 200 Å.

Light Lc reflected by the opposite electrode 400 and light Ld reflected by the reflection prevention auxiliary layer 420 from among light incident to the display device 3 from outside may destructively interfere with each other. Thus, light visible to the outside of the display device 3 may decrease, that is, reflectivity of external light may be reduced.

The inorganic barrier layer 430 may be on the reflection prevention auxiliary layer 420. The inorganic barrier layer 430 may include, for example, LiF. The inorganic barrier layer 430 may help prevent the reflection prevention auxiliary layer 420, etc. from being damaged during a process of forming the first inorganic layer 510 of the encapsulation layer 500.

The structure of the reflection prevention auxiliary layer 420 arranged above the opposite electrode 400 with the capping layer 410 disposed therebetween may be provided to the display device 4 having a micro cavity. As illustrated in FIG. 9, the capping layer 410, the reflection prevention auxiliary layer 420, and the inorganic barrier layer 430 may be sequentially stacked on the opposite electrode 400. The respective configurations are the same as those described above with reference to FIG. 8.

The display device 4 illustrated in FIG. 9 includes both a micro cavity structure and the reflection prevention auxiliary layer 420. Thus, the display device 4 may significantly reduce reflectivity of external light. The reflection prevention auxiliary layer 420 is further provided and thus emission efficiency of light in the first to third intermediate layers 310, 320, and 330 may reduce more or less. According to an embodiment, each pixel P includes a micro cavity structure and thus may improve light efficiency of light emitted from the first to third intermediate layers 310, 320, and 330.

Although FIGS. 8 and 9 illustrate that the substrate 100A includes the first and second plastic layers 111A and 115B and the black organic layer 113A therebetween, other configurations may be used. As described with reference to FIGS. 4 to 6, the substrates 100B, 100C, and 100D of the display devices 3 and 4 may have various structures.

By way of summation and review, to make an image produced by the organic light-emitting display device readable not only in an indoor space but also in an outdoor space (the outside), a polarization plate may be used. A polarization plate may reduce the brightness of light emitted from a display device. Also, a polarization plate that is thick may thus increase an overall thickness of the display device.

As described above, embodiments may provide a display device that reduces reflectivity of external light without polarization plate. Embodiments may improve display quality of a display device by reducing reflectivity of external light and improving outdoor visibility.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a substrate including a first plastic layer, a second plastic layer on the first plastic layer, and a black organic layer between the first and second plastic layers;
   a buffer layer on the substrate;
   a thin film transistor on the buffer layer, wherein the thin film transistor includes a semiconductor layer and a gate electrode overlapping a channel region of the semiconductor layer; and
   a plurality of display elements, at least one of the display elements being electrically connected to the thin film transistor, the display elements respectively being arranged in a plurality of pixels.

2. The display device as claimed in claim 1, wherein the first and second plastic layers are flexible.

3. The display device as claimed in claim 1, wherein the substrate further includes an inorganic layer between the first and second plastic layers.

4. The display device as claimed in claim 3, wherein the inorganic layer includes at least one of amorphous silicon, silicon oxide, and silicon nitride.

5. The display device as claimed in claim 1, wherein the black organic layer contacts at least one of the first and second plastic layers.

6. The display device as claimed in claim 1, wherein a thickness of the black organic layer is smaller than those of the first and second plastic layers.

7. The display device as claimed in claim 1, wherein the black organic layer has a thickness of about 5 μm or less.

8. The display device as claimed in claim 1, further comprising a light shield on the plurality of display elements.

9. The display device as claimed in claim 8, wherein the light shield is arranged between adjacent pixels from among the plurality of pixels.

10. The display device as claimed in claim 8, further comprising an encapsulation layer including at least one organic layer and at least one inorganic layer, the encapsulation layer being between the plurality of display elements and the light shield.

11. The display device as claimed in claim 8, further comprising a color filter between light shields.

12. The display device as claimed in claim 1, wherein the black organic layer is one body and corresponds to the plurality of pixels.

13. The display device as claimed in claim 1, wherein the buffer layer includes an inorganic material.

14. The display device as claimed in claim 1, wherein one of the semiconductor layer and the gate electrode is directly on the buffer layer.

15. The display device as claimed in claim 1, wherein each of the plurality of display elements includes:
   a pixel electrode electrically connected to the thin film transistor;
   an intermediate layer on the pixel electrode and including an emission layer; and
   an opposite electrode, which is a semi-transmissive layer, the opposite electrode being on the intermediate layer.

16. The display device as claimed in claim 15, wherein:
   the plurality of display elements include a first display element of a first color and a second display element of a second color, and
   a distance between a pixel electrode of the first display element and an opposite electrode is different from a distance between a pixel electrode of the second display element and an opposite electrode.

17. The display device as claimed in claim 15, further comprising:
- a capping layer on the opposite electrode; and
- a reflection prevention auxiliary layer on the opposite electrode with the capping layer provided therebetween.

18. The display device as claimed in claim 17, wherein the reflection prevention auxiliary layer includes at least one of Ti, Mo, and Mn.

19. The display device as claimed in claim 17, wherein light reflected by the opposite electrode destructively interferes with light reflected by the reflection prevention auxiliary layer.

\* \* \* \* \*